United States Patent
Solal

(10) Patent No.: US 10,284,176 B1
(45) Date of Patent: May 7, 2019

(54) TEMPERATURE COMPENSATED SURFACE ACOUSTIC WAVE DEVICE AND METHODS OF MANUFACTURING THE SAME

(71) Applicant: TriQuint Semiconductor, Inc., Hillsboro, OR (US)

(72) Inventor: Marc Solal, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 779 days.

(21) Appl. No.: 14/730,001

(22) Filed: Jun. 3, 2015

(51) Int. Cl.
| | |
|---|---|
| H03H 9/64 | (2006.01) |
| H03H 9/54 | (2006.01) |
| H03H 9/25 | (2006.01) |
| H01L 41/29 | (2013.01) |
| H03H 3/02 | (2006.01) |
| G10K 11/18 | (2006.01) |

(52) U.S. Cl.
CPC ............. *H03H 9/64* (2013.01); *G10K 11/18* (2013.01); *H01L 41/29* (2013.01); *H03H 3/02* (2013.01); *H03H 9/25* (2013.01); *H03H 9/54* (2013.01)

(58) Field of Classification Search
CPC .. H03H 9/64; H03H 3/02; H03H 9/25; H03H 9/54; H01L 41/29
USPC ..................................................... 310/313 R
See application file for complete search history.

(56) References Cited

U.S. PATENT DOCUMENTS

| | | | |
|---|---|---|---|
| 7,576,471 B1 | 8/2009 | Solal | |
| 7,939,989 B2 | 5/2011 | Solal et al. | |
| 8,294,330 B1 * | 10/2012 | Abbott | H03H 9/02834 310/313 A |
| 8,294,331 B2 | 10/2012 | Abbott et al. | |
| 2005/0237132 A1 * | 10/2005 | Sano | H03H 3/02 333/189 |
| 2006/0139122 A1 * | 6/2006 | Asai | H03H 3/02 333/133 |
| 2012/0325014 A1 * | 12/2012 | Pulley | G01F 1/3263 73/861.22 |
| 2013/0106535 A1 | 5/2013 | Abbott et al. | |
| 2013/0342286 A1 * | 12/2013 | Abbott | H03H 9/0222 333/193 |

OTHER PUBLICATIONS

Experiments with Magnets and conductors Densities of Materials Sheet.*

(Continued)

*Primary Examiner* — Bryan P Gordon
(74) *Attorney, Agent, or Firm* — Withrow & Terranova, P.L.L.C.

(57) ABSTRACT

Embodiments described herein may provide a surface acoustic wave (SAW) device, methods of fabricating the SAW device, and a system incorporating the SAW device. The SAW device may include a piezoelectric substrate and individual resonators may be formed by a plurality of electrodes on the surface of the piezoelectric substrate. A dielectric layer having a positive thermal coefficient of frequency (TCF) may be formed on each of the plurality of electrodes. In various embodiments, temperature compensation may be achieved by providing more or less of the dielectric layer on at least one resonator than on the other resonators based on a configuration of the resonators. In various embodiments, temperature compensation may be achieved by providing at least one resonator with a different duty factor than the other resonators based on a configuration of the resonators.

18 Claims, 13 Drawing Sheets

(56) References Cited

OTHER PUBLICATIONS

Abbott, Ben, et al.; "Theoretical Investigation into Spurious Modes Content in SAW Devices with a Dielectric Overcoat;" proc. of the 2010 International Symposium on Acoustic Wave Devices for Future Mobile Communication Systems, Keyaki Hall, Chiba University, pp. 199-210; Mar. 2010.

Abbott, Ben, et al.; "Recent Advances in SAW Technology;" proc. of the 2012 International Symposium on Acoustic Wave Devices for Future Mobile Communication Systems, Keyaki Hall, Chiba University, pp. 73-78; Dec. 2012.

Solal, Marc, et al.; "Transverse modes suppression and loss reduction for buried electrodes SAW devices;" 2010 IEEE International Ultrasonics Symposium Proceedings, pp. 624-628; Oct. 2010.

Solal, Marc, et al.; "A method to reduce losses in buried electrodes RF SAW resonators;" 2011 IEEE International Ultrasonics Symposium, pp. 324-332; Oct. 2011.

Kadota et al.; "SAW Substrate with Coupling Factor and Excellent Temperature Stability Suitable for Duplexer of PCS in US"; 2004 IEEE Ultrasonics, Ferroelectrics and Frequency Control Joint 50th Anniversary Conference; pp. 1970-1975; 2004.

Parker et al.; "Temperature Stable Surface Acoustic Wave Delay Lines with SiO2 Film Overlays"; IEEE Ultrasonic Symp. Proc.; pp. 295-298; 1974.

Yamanouchi et al.; "SAW Properties of SiO2/128 degree Y-Z LinbO3 Structure Fabricated by Magnetron Sputtering Technique"; IEEE Transactions on Sonics and Ultrasonics; vol. SU-31, No. 1; pp. 51-57; Jan. 1984.

Yamanouchi et al.: "High Temperature Stable GHz-Range Low-Loss Wide Band Transducers and Filter Using SiO2/LiNbO3, LiTaO3"; IEEE Transactions on Ultrasonics, Ferroelectrics, and Frequency Control; vol. 42, No. 3; pp. 392-396; May 1995.

\* cited by examiner h1 > h2 h1 > h2

TEMPERATURE COMPENSATED SURFACE ACOUSTIC WAVE DEVICE AND METHODS OF MANUFACTURING THE SAME

FIELD

Embodiments of the present disclosure generally relate to electronic circuits, and in particular, surface acoustic wave (SAW) devices.

BACKGROUND

Surface acoustic wave (SAW) devices (also referred to as "SAW filters") are used for many applications, such as radio frequency (RF) filters and duplexers. SAW devices use the propagation of acoustic waves at the surface of a piezoelectric substrate, where their frequency is proportional to a velocity of the surface acoustic waves. SAW devices may combine low insertion loss with relatively good rejection, and can achieve broad bandwidths. Most SAW devices are sensitive to changes in temperature. However, many apparatuses and systems implementing SAW devices require the SAW devices to operate in relatively wide temperature range, such as −30 degrees Celsius to 85 degrees Celsius (deg. C.) or wider.

When the temperature of a SAW device changes, the velocity of the surface acoustic wave may also change, which may cause the SAW device response to experience a shift in frequency. This limitation has become more significant as consumer radio-frequency (RF) devices are specified to operate across a wide temperature range. Additionally, due to thermal expansion, the component dimensions of the SAW device may change, which may also lead to a frequency or response shift. These frequency shifts may result in an overall degradation of performance.

The thermal sensitivity of a SAW device is usually measured by a coefficient called the temperature coefficient of frequency (TCF), which is measured in parts per million per degree Celsius (ppm/deg. C.). Most materials used in the construction of SAW devices have a negative TCF, which typically causes a SAW device's response to shift toward lower frequencies as the temperature of the SAW device increases. However, some dielectric materials, such as silicon oxide materials, have been shown to exhibit a positive TCF. A positive TCF typically causes a SAW device's response to shift toward larger frequencies as the SAW device's temperature increases. Thus, one approach known to reduce the thermal sensitivity of SAW devices consists of burying or otherwise covering the electrodes of a SAW device under a film of silicon oxide material. By adding a silicon oxide material on top of the piezoelectric substrate, temperature compensation may be obtained, thereby allowing a SAW device to have better thermal stability.

Unfortunately, due to the properties of the piezoelectric material used in many SAW devices, the frequency shift of a SAW device response due to a change in temperature may not be uniform with the frequency of the input signal. In other words, the effect of the temperature on the frequency response of a SAW device may be a frequency shift, which may depend on the frequency of the input signal. This may lead to some deformation of the filter response. A typical SAW filter may exhibit a transition from the cutoff frequency to the pass band at the low frequency side of the graph (also referred to as a "low band transition", "low frequency skirt", and/or the like) that is stable as the temperature changes. However, the transition from the passband to the cutoff frequency at the high frequency side of the graph (also referred to as a "high frequency transition", "high band transition", "high frequency skirt", and/or the like) may not be fully temperature compensated even though such a SAW filter has very small TCF for the low frequency skirt. Reciprocally, the high frequency side transition may be relatively stable with the temperature while the low frequency transition shifts. This may be due to the SAW filter having a better temperature compensation for some frequencies than others.

Furthermore, some SAW filter applications may only require a relatively steep transition for one side of the response while not requiring a relatively steep transition for the other side of the response. For example, some SAW filter applications may require a 2 MHz transition between a passband and a stopband for a low frequency side of a response, while requiring a 20 MHz transition for the high frequency side of the response. However, providing relatively good temperature compensation may require forming a SAW device to have a relatively large dielectric material thickness, which may result in a reduction of the piezoelectric coupling coefficient and may limit the possible relative bandwidth of the SAW filter. Accordingly, having a small TCF only on the low frequency side of the response, for example, may allow a SAW device to meet low frequency skirt requirements while allowing a wider passband. Therefore, providing different TCFs for different portions of SAW devices may be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 12 illustrates a first stage of forming a SAW device and FIG. 13 illustrates a second and third stage of forming the SAW device.

DETAILED DESCRIPTION

Figure 1:
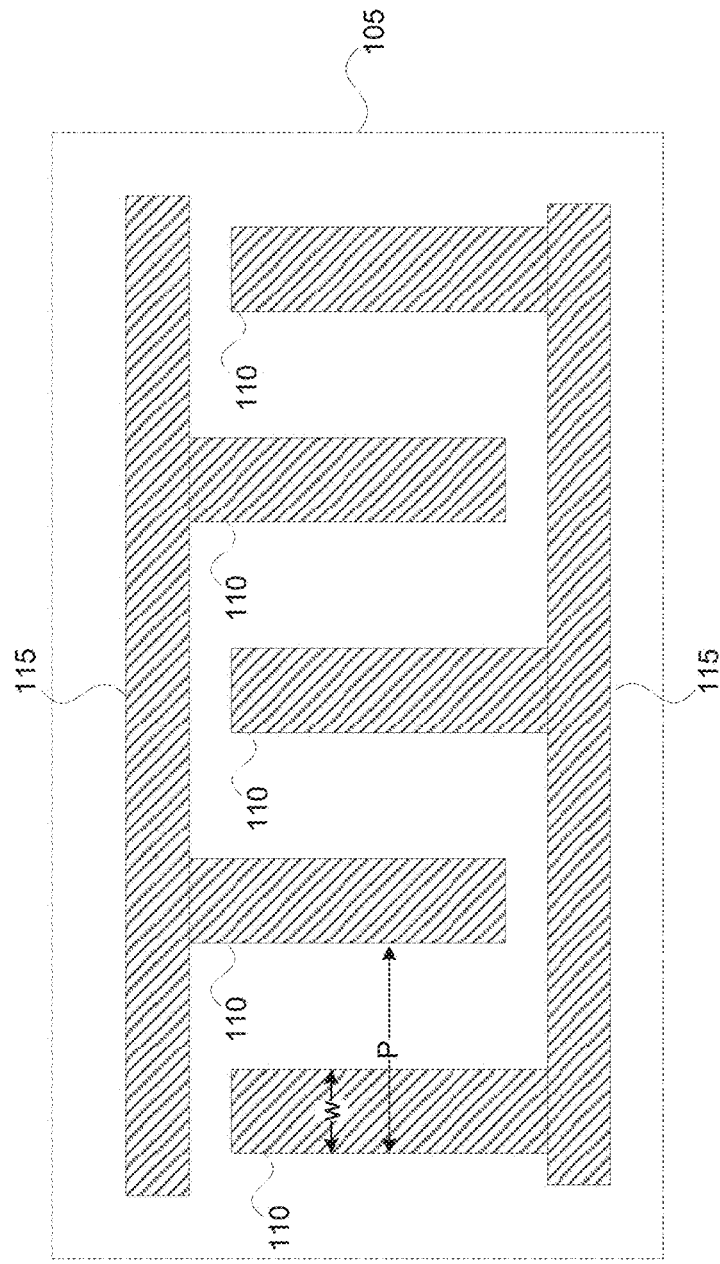
FIG. 1 illustrates a top view of an interdigital transducer (IDT), in accordance with various example embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well-known devices, circuits, and methods are omitted so as not to obscure the description of the present invention with unnecessary detail.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in various embodiments", "in some embodiments", and the like are used repeatedly. The phrase generally does not refer to the same embodiments; however, it may. The terms "comprising," "having," and "including" are synonymous, unless the context dictates otherwise.

The phrase "A and/or B" means (A), (B), or (A and B). The phrases "A/B" and "A or B" mean (A), (B), or (A and B), similar to the phrase "A and/or B". For the purposes of the present disclosure, the phrase "at least one of A and B" means (A), (B), or (A and B).

The description may use the phrases "in an embodiment", or "in embodiments", which may each refer to one or more of the same or different embodiments. Furthermore, the terms "comprising," "including," "having," and the like, as used with respect to embodiments of the present disclosure, are synonymous.

It should be noted that example embodiments may be described as a process depicted as a flowchart, a flow diagram, a data flow diagram, a structure diagram, or a block diagram. Although a flowchart may describe the operations as a sequential process, many of the operations may be performed in parallel, concurrently, or simultaneously. In addition, the order of the operations may be re-arranged. A process may be terminated when its operations are completed, but may also have additional steps not included in the figure(s). A process may correspond to a method, a function, a procedure, a subroutine, a subprogram, and the like. When a process corresponds to a function, its termination may correspond to a return of the function to the calling function and/or the main function.

As used herein, the term "circuitry" refers to, is part of, or includes hardware components such as an Application Specific Integrated Circuit (ASIC), an electronic circuit, a logic circuit, a processor (shared, dedicated, or group) and/or memory (shared, dedicated, or group) that are configured to provide the described functionality. In some embodiments, the circuitry may execute one or more software or firmware programs to provide at least some of the described functionality. Example embodiments may be described in the general context of computer-executable instructions, such as program code, software modules, and/or functional processes, being executed by one or more of the aforementioned circuitry. The program code, software modules, and/or functional processes may include routines, programs, objects, components, data structures, etc. that perform particular tasks or implement particular data types. The program code, software modules, and/or functional processes discussed herein may be implemented using existing hardware in existing communication networks. For example, program code, software modules, and/or functional processes discussed herein may be implemented using existing hardware at existing network elements or control nodes.

As used herein, the term "wireless communication device" may be considered synonymous to, and may hereafter be occasionally referred to, as user equipment (UE), a client, mobile, mobile device, mobile terminal, user terminal, mobile unit, mobile station, mobile user, subscriber, user, remote station, access agent, user agent, receiver, etc., and may describe a remote user of network resources in a communications network. Furthermore, the term "wireless communication device" may include any type of wireless/wired device such as consumer electronics devices, cellular phones, smart phones, tablet personal computers, wearable computing devices, personal digital assistants (PDAs), desktop computers, and laptop computers, for example.

As herein described, reference to and the use of the terms surface acoustic wave (SAW), SAW device, SAW filter, etc., are intended for any device using the propagation of elastic waves on the surface of a material, in or several layers of one or more materials, or at the interface of several materials. It is to be understood that the disclosure herein described may be applied to any type elastic waves as long as they can be generated or detected using IDTs. For example, so called Leaky SAWs, Pseudo SAWs, Boundary Waves, Surface Transverse Waves, Interface Waves, Love Waves, Lamb Waves, and the like are considered herein to be SAWs.

It should be noted that the figures are only schematic representations of the example embodiments. For example, interdigital transducers (IDTs) and/or gratings as shown in the figures may comprise many more electrodes than the number of electrodes shown in the figures. Furthermore, standard IDT implementations, such as dummy electrodes, apodization, and/or use of piston mode transducers are not shown and described. However, the example embodiments disclosed herein may also be applied to the aforementioned IDT implementations and/or other IDT implementations. Furthermore, the SAW devices disclosed herein are described only as working in a single-ended mode. However, a person having ordinary skill in the art should appreciate that the SAW devices disclosed herein may be modified to handle balanced or differential input/output or a single-ended input or output with a balanced or differential output or input. This may be done by designing coupled resonator filters accordingly and/or by realizing a double ladder filter for a balanced/balanced or differential/differential configuration. The example embodiments may apply for these cases as long as the amount of silicon oxide on the resonators is chosen accordingly.

FIG. 1 illustrates an example of an interdigital transducer (IDT) 105, in accordance with various example embodiments. The IDT 105 of FIG. 1 may be formed on top of a piezoelectric substrate, such as piezoelectric substrate 1205 as shown and described with regard to FIGS. 12-13. IDT 105 may include two opposing busbars 115 at two different electrical potentials and a plurality of electrodes 110 connected to the two busbars 115. Due to the piezoelectric effect, the electrical field between two successive electrodes 110 at a different potential provides an acoustical source. If the IDT 105 receives an incoming wave, charges are generated in the electrodes 110 as a result of piezoelectric effect.

As shown in FIG. 1, each electrode 110 has a width W and a period P. In various embodiments, for a given medium and signal frequency, a duty factor of the IDT 105 may be defined as a ratio of the width W of the plurality of electrodes 110 to the electrode period P of the plurality of electrodes 110. Therefore, according to various embodiments, a desired duty factor may be achieved by forming the IDT 105 such that the electrodes 110 have a desired width W and/or electrode period P. According to various example embodiments, in order to achieve temperature compensation, the electrodes 110 may have a thickness that is between about 5% and about 15% of their electrode period P. It should also be noted that, in accordance with various embodiments, the resonators 300 may be buried or otherwise covered in a dielectric material (not shown), such as a silicon oxide material. In various embodiments, the silicon oxide material may be silicon dioxide ($SiO_2$), or the silicon oxide material may be $SiO_x$ where x is a number relatively close to 2, but may not be equal to 2. It should be noted that a distance between individual electrodes forming the IDT 105 may influence a duty factor of the IDT 105.

Figure 2:
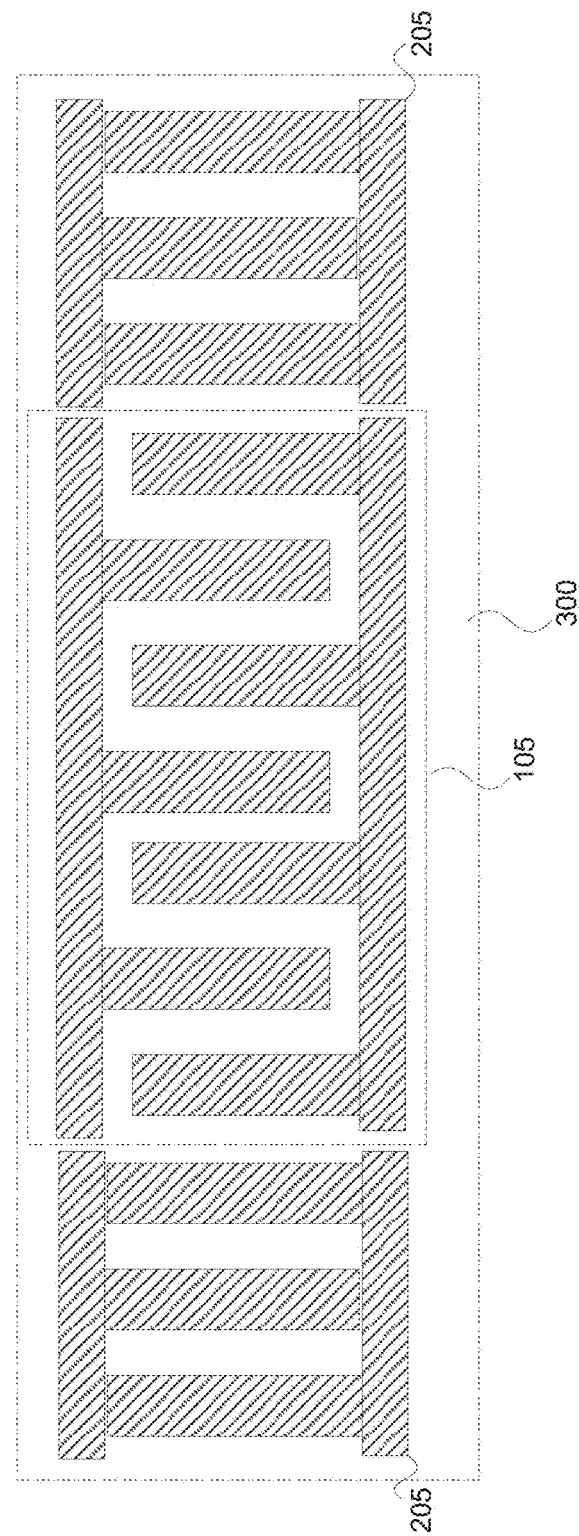
FIG. 2 illustrates is a top view of a SAW resonator, in accordance with various example embodiments.
Figure 3:
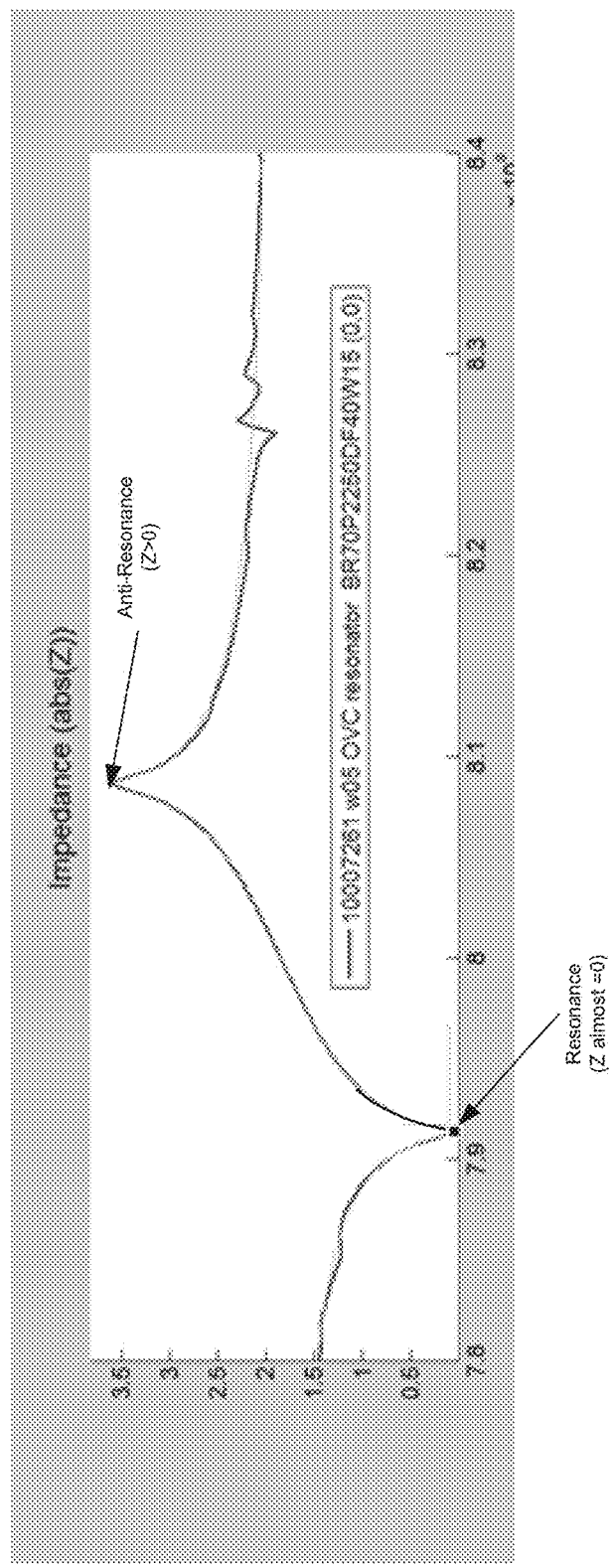
FIG. 3 illustrates a graph of frequency variations of the impedance of a typical resonator, in accordance with various example embodiments.

Referring to FIG. 2, a resonator 300 may be formed by placing the IDT 105 between two reflective gratings 205. As is known, filters or duplexers can be designed by connecting one or more resonators 300 in various configurations and/or by having one or several transmitting IDTs 105 generating acoustic energy, wherein the acoustic energy is received by one or several IDTs 105. It should also be noted that although the resonator 300 shown by FIG. 2 includes one IDT 105 in between two gratings 205, the example embodiments are not limited thereto. In various example embodiments, multiple IDTs 105 may be formed between gratings 205. The frequency variation of the impedance of the resonator 300 is shown by the graph of FIG. 3. The duty factor of the resonator may not be constant. Since most of the energy is in the IDT 105, the TCF is influenced mostly by the IDT 105 duty factor. If the duty factor of the IDT 105 varies, then the average duty factor in the IDT 105 should be considered.

FIG. 3 illustrates a graph showing frequency variations of the impedance of a resonator, such as the resonator 300. At the resonance frequency, the impedance of the resonator may be relatively small or close to zero. When the impedance of the resonator is relatively small or close to zero, the resonator may behave like a short circuit. At the anti-resonance frequency, the resonator impedance may be relatively large. When the resonator impedance is relatively large, the resonator may behave like an open circuit.

Figure 4:
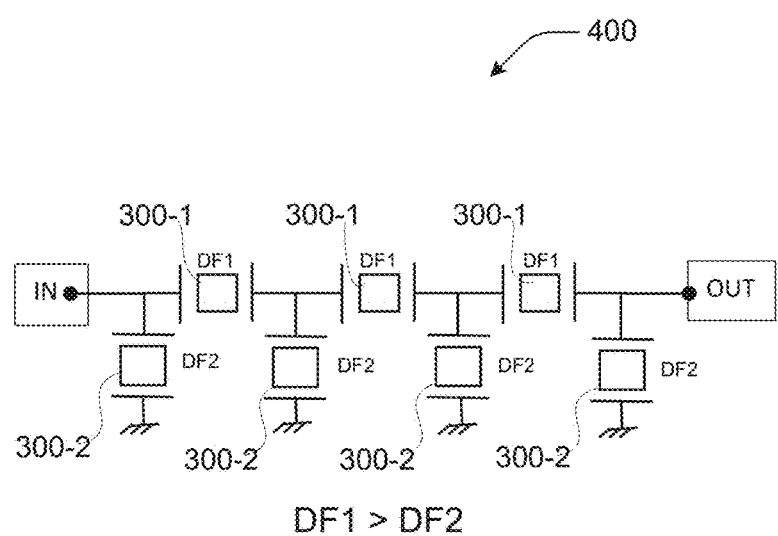
FIG. 4 illustrates a circuit diagram of a ladder filter, in accordance with various example embodiments.

FIG. 4 illustrates a circuit diagram of a ladder filter 400 in accordance with various example embodiments. As shown, the ladder filter 400 includes first resonators 300-1 which are connected in series (also referred to as "series resonators 300-1"), second resonators 300-2 that are connected in parallel (also referred to as "parallel resonators 300-2" and/or "shunt resonators 300-2"), an input terminal IN, and an output terminal OUT.

The series resonators 300-1 and the shunt resonators 300-2 may be electrically connected to one another to form a ladder network. The resonators 300-1 and 300-2 may be designed in such a way that the resonance frequency of the series resonators 300-1 and the anti-resonance frequency of the shunt resonators 300-2 are close to the center of a passband. Because the series resonators 300-1 may be electrically equivalent to a short circuit at the center frequency of the passband, and the shunt resonators 300-2 may be equivalent to an open circuit at the center frequency of the passband, the ladder filter 400 may have relatively low losses in the passband. Inversely, at its resonance frequency, the shunt resonators 300-2 may be equivalent to a short circuit, which may cause a notch in a filter transfer function of the ladder filter 400. Similarly, at its anti-resonance frequency, the series resonators 300-1 may be equivalent to an open circuit, which may also result in a notch in the filter transfer function of ladder filter 400. In some applications, the frequencies of all the resonators 300 may be designed in such a way as to obtain desired responses in presence of parasitic elements that may affect the desired response, such as stray capacitances and inductances, and/or inductances or capacitances that may be used to improve the response. However, the lower band edge of the passband may depend on the resonance frequencies of the shunt resonators 300-2 and the higher band edge of the passband may depend on the anti-resonance frequencies of the series resonators 300-1.

In a typical ladder filter, each of the series resonators 300-1 and each of the shunt resonators 300-2 may have the same duty factor DF. In this case, the TCF for the low frequency transition of the filter may be different from the TCF for the high frequency transition. This means that the temperature compensation may work well for only one side of the response but not both sides of the response. This may make it difficult to design SAW filters and/or SAW devices with steep transitions on both sides of the response if they need to operate in a large temperature range. By contrast, the ladder filter 400 may operate in a same or similar fashion as a typical ladder filter, however, in accordance with various example embodiments, one or more of the series resonators 300-1 may be formed such that the duty factor DF1 of the one or more of the series resonators 300-1 is larger than a duty factor DF2 of one or more of the shunt resonators 300-2. In various embodiments, the duty factor DF1 may be at least 10% greater than the duty factor DF2 in order to achieve relatively good temperature compensation on both of the low frequency transitions and high frequency transitions. In various embodiments, the thickness of dielectric layer and the duty factor DF1 may be chosen to obtain a relatively good temperature compensation for at least one of the series resonators 300-1. In such embodiments, the TCF of at least one series resonator 300-1 may be between +/10 ppm/deg. C. and preferably between +/−3 ppm/deg. C.

As noted previously, a desired duty factor of an IDT 105 and/or a resonator 300 to which the IDT 105 belongs, may be achieved by forming the IDT 105 with electrodes 110 having a certain width W and/or electrode period P. Therefore, in accordance with various embodiments, one or more of the series resonators 300-1 may be formed such that the electrodes 110 have a width W and/or an electrode period P that give the one or more series resonators 300-1 a larger duty factor DF1 than the duty factor DF2 of one or more of the shunt resonators 300-2. The specific values for the width W and/or the electrode period P may be application specific and chosen according to one or more filter and/or system design choices.

Additionally or alternatively, in various embodiments, the ladder filter 400 may obtain temperature compensation by forming the one or more shunt resonators 300-2 to have an electrode period P and a width W such that a duty factor DF2 of the one or more shunt resonators 300-2 is between about 35% and about 45%. For example, the values of the width W and/or the electrode period P of the electrodes 110 forming the one or more shunt resonators 300-2 may be adjusted so that a ratio of the width W to the electrode period P is between about 0.35 and about 0.45. Additionally or alternatively, in various embodiments, the one or more series resonators 300-1 may be formed having an electrode period P and a width W such that a duty factor DF1 of the one or more series resonators 300-1 is greater than about 50%. For example, the values of the width W and/or the electrode period P of the electrodes 110 forming the one or more series resonators 300-1 may be adjusted so that a ratio of the width W to the electrode period P is greater than about 0.5.

It should be noted that, although FIG. 4 illustrates each of the series resonators 300-1 having a duty factor DF1 and each of shunt resonators 300-2 having a duty factor DF2, the example embodiments are not limited thereto. In various example embodiments, only one of the series resonators 300-1 may have a duty factor DF1 that is greater than the duty factors for each of the other series resonators 300-1 and/or each of the shunt resonators 300-2. In some embodiments, only one of the shunt resonators 300-2 may have a duty factor DF2 that is less than the duty factors for each of the other shunt resonators 300-2 and/or each of the series resonators 300-1. The duty factors for each of the series resonators 300-1 and each of the shunt resonators 300-2 may be application specific and chosen based on one or more filter and/or system design choices.

It should also be noted that, although the example embodiment of FIG. 4 shows a ladder filter having at least one series resonator 300-1 with a duty factor DF1 that is greater than a duty factor DF2 of the shunt resonators 300-2, the example embodiments are not limited thereto. According to various other example embodiments, the duty factor DF1 of at least one series resonator 300-1 may be similar to the duty factor DF2 of the shunt resonators 300-2. The duty factors for the series resonators 300-1 and the shunt resonators 300-2 may be altered to achieve relatively good temperature compensation on both sides of the response. The duty factors for each of the series resonators 300-1 and each of the shunt resonators 300-2 may be application specific and chosen based on one or more filter and/or system design choices and in order to achieve relatively good temperature compensation on one or both sides of the frequency response. For instance, in various embodiments, the thickness of a dielectric layer and the duty factor DF2 may be chosen to obtain relatively good temperature compensation for at least one of the shunt resonators 300-2. In such embodiments, the TCF of at least one shunt resonator 300-2 may be between +/−10 ppm/deg. C. and preferably between +/−3 ppm/deg. C.

Figure 5:
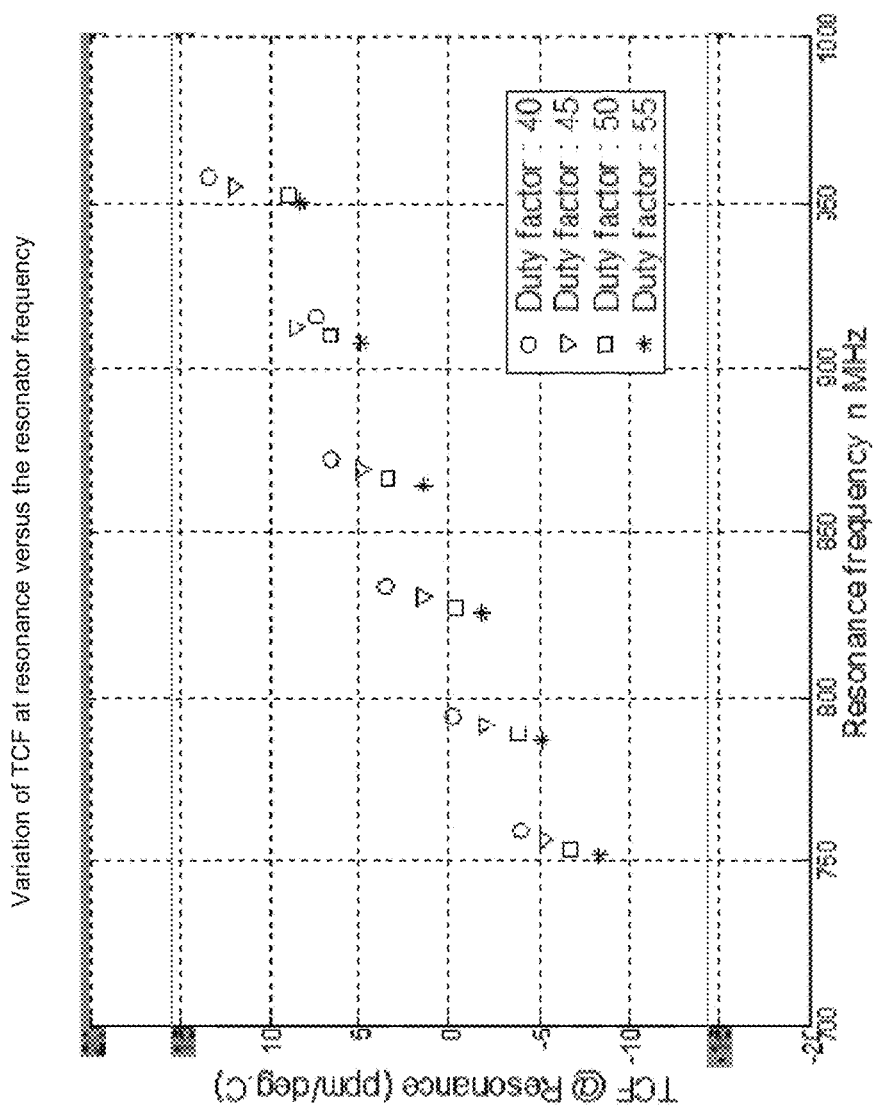
FIG. 5 illustrates a graph of a measured thermal coefficient of frequency (TCF) at resonance versus the resonator frequency for resonators with different duty factors, in accordance with various example embodiments.
Figure 6:
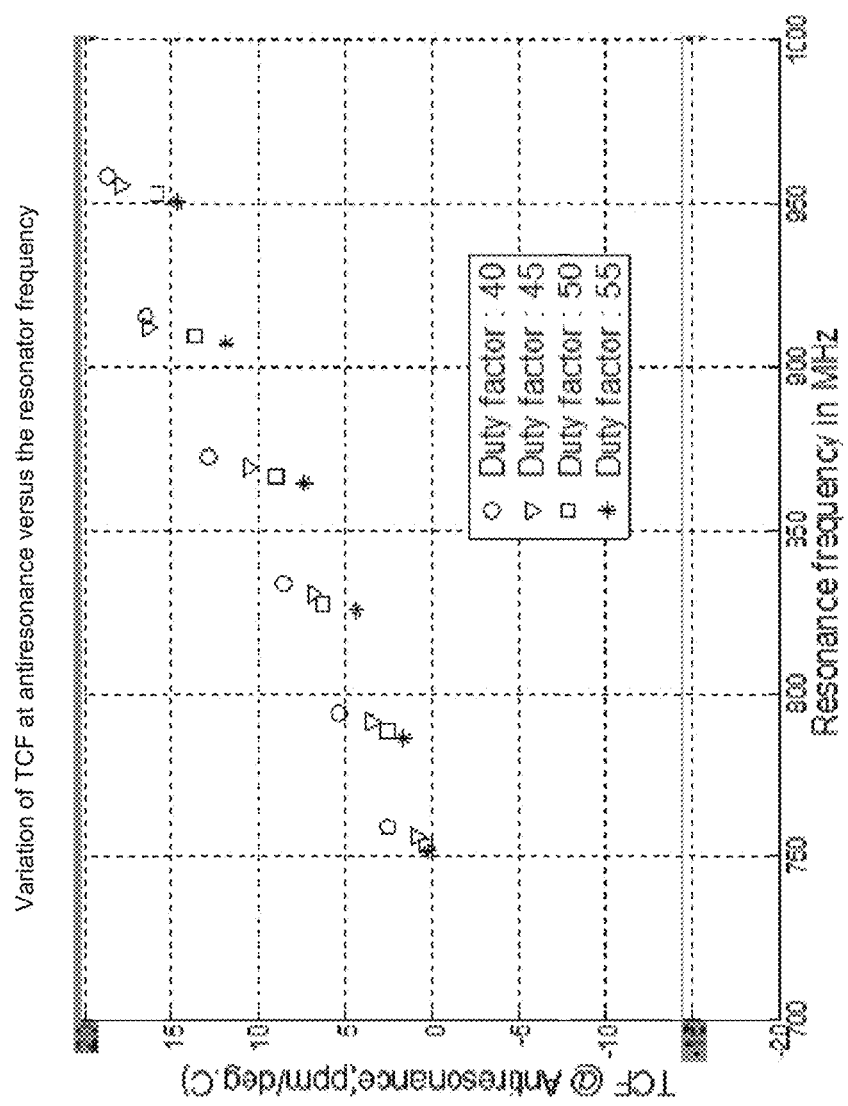
FIG. 6 illustrates a graph showing a measured TCF at anti-resonance versus the resonator frequency for the resonators of FIG. 6, in accordance with various example embodiments.

FIG. 5 is a graph showing a measured TCF at resonance versus the resonator frequency for resonators with different duty factors and periods, and FIG. 6 is a graph showing a measured TCF at anti-resonance versus the resonator frequency for the resonators of FIG. 5.

The resonators used for the examples illustrated by FIGS. 5-6 (referred to as the "example resonators") were formed in such a way that a first one of the example resonators has a 40% duty factor, a second one of the example resonators has a 45% duty factor, a third one of the example resonators has a 50% duty factor, and a fourth one of the example resonators has a 55% duty factor. Each of the example resonators were formed to have a substrate of lithium niobate (LiNbO3) with an orientation and/or cut angle of Y+127 degrees. The electrodes of the example resonators were formed of a layer of 150 A of titanium (Ti), a layer 2500A of copper (Cu), and a layer 300A of aluminum (Al). The electrodes of the example resonators were buried inside a silicon dioxide ($SiO_2$) dielectric layer having a thickness of 1.75 μm above the electrodes. Several resonators with different periods were manufactured in order to vary the resonance frequency of the resonators.

Referring to FIGS. 5-6, the first example resonator having a 40% duty factor and a resonance frequency of around 780 megahertz (MHz) had a measured TCF close to 0 ppm/deg. C., while the TCF for the first example resonator having a 40% duty factor was measured to be about +5 ppm/deg. C. at the anti-resonance frequency. Additionally, when first example resonator with the 40% duty factor had a resonance frequency close to 750-760 MHz, the TCF was measured to be about −3 ppm/deg. C. and the TCF at the anti-resonance frequency was measured to be about +2.5 ppm/deg. C.

For the fourth example resonator having a duty factor of 55% and having a resonance frequency of around 780 MHZ, the TCF at the resonance frequency was measured to be −5 ppm/deg. C., while the TCF at the anti-resonance frequency was measured to be close to +1 ppm/deg. C. Additionally, when fourth example resonator with the 55% duty factor had a resonance frequency close to 750-760 MHz, the TCF was measured to be about −8 ppm/deg. C. and the TCF at the anti-resonance frequency was measured to be close to 0 ppm/deg. C.

As shown by FIGS. 5-6, the TCF becomes larger as the duty factor becomes smaller. This effect may be due to the presence of more $SiO_2$, which is a dielectric material having a positive TCF, between the electrodes 110 forming the example resonators. The example resonators having a smaller duty factor may have more dielectric material because electrode width W may be smaller and/or the electrode period P may be greater for those resonators. Furthermore, as shown by FIGS. 5-6, if the TCF is close to 0 at resonance, then the TCF is larger than 0 at anti-resonance, and thus, temperature compensation for both low frequency skirts and high frequency skirts cannot be achieved if the duty factor is the same for the shunt and series resonators. Accordingly, by designing a SAW device to have resonators with different duty factors, temperature compensation for both low frequency skirts and high frequency skirts may be achieved. This is because, as noted previously, the shunt resonators resonance typically influence the low frequency transition while the series resonators antiresonance typically influence the high frequency transitions. Thus, by choosing a larger duty factor for the series resonators, a high frequency transition can be temperature compensated, and by choosing a smaller duty factor for the shunt resonators, a low frequency transition can be temperature compensated.

Based on the results shown by FIGS. 5-6, in various embodiments, a SAW device formed with one or more shunt resonators 300-2 having 40% duty factor and one or more series resonators 300-1 having 50% to 55% duty factor may be temperature compensated for both high frequency transitions and low frequency transitions. Therefore, various example embodiments provide that a duty factor of one or more series resonators 300-1 that is at least 10% greater than a duty factor of one or more shunt resonators 300-2 may provide temperature compensation for both high frequency transitions and low frequency transitions depending on one or more applications and/or design choices. Also, based on the results shown by FIGS. 5-6, it may be advantageous to use a substrate of lithium niobate (LiNbO3) with an orientation and/or cut angle between Y+120 degrees and Y+140 degrees, and in such embodiments, relatively good temperature compensation may be obtained when the dielectric material thickness measured above the electrodes is between 0.65 and 0.85 times the electrode period P.

It should be noted that, in various embodiments, the frequencies of the shunt resonators 300-2 may not be the same. As noted previously, temperature variation affects the transition close to passband frequencies. For example, resonators 300 that are close to a center frequency of a passband may be the ones which obtain a transition while other resonators 300 that are lower in frequency may obtain a wide band rejection. Therefore, lower duty factors may be useful for obtaining temperature compensation of the higher frequency shunt resonators 300-2 with a resonance below the passband, and larger duty factors may be useful for obtaining temperature compensation for series resonators 300-1 having a relatively low frequency with an antiresonance above the passband. By providing a relatively low duty factor for higher frequency shunt resonators 300-2 and providing a relatively high duty factor for low frequency series resonators 300-1, a temperature compensated transition from the passband to the rejection band may be achieved.

It should also be noted that the example embodiments are not limited to ladder filter configurations. In various embodiments, SAW devices using one or several coupled resonator filter (CRF), which may be referred to as a double mode SAW (DMS) filter, cascaded or otherwise coupled with one or more shunt resonators 300-2 and/or one or more series resonators 300-1 may obtain temperature compensation by varying the duty factor of at least one shunt resonator 300-2, at least one series resonator 300-1, and/or the CRF. In such embodiments, the low frequency transition between rejection and the passband may be provided by both the CRF and/or one or more shunt resonators 300-2, while the high frequency transition may be provided by one or more series resonators 300-1. This is shown by the example embodiment of FIG. 7.

Figure 7:
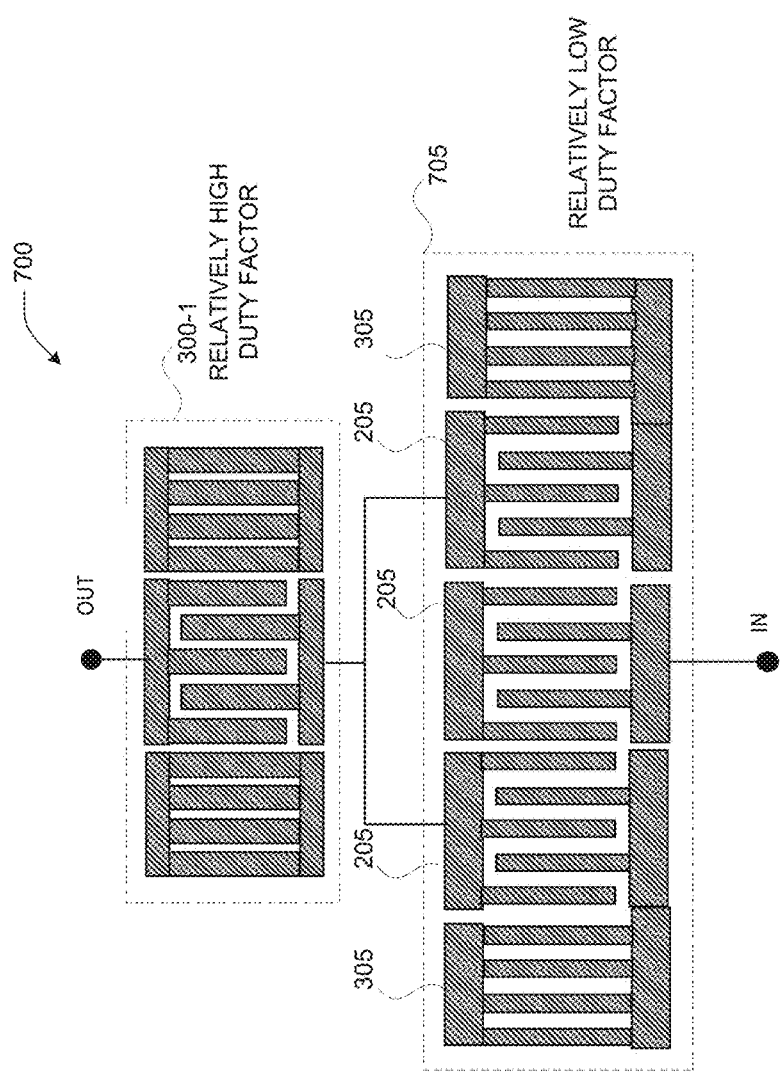
FIG. 7 illustrates a circuit diagram of a SAW device including a coupled resonator filter coupled resonator filter (CRF), in accordance with various example embodiments.

FIG. 7 illustrates a SAW device 700 including a CRF 705 with a relatively low duty factor coupled with a series resonator 300-1 having a relatively large duty factor, in accordance with various example embodiments. As shown, SAW device 700 includes an input terminal IN, an output terminal OUT, CRF 705, and a series resonator 300-1. CRF 705 is formed of, or otherwise includes a plurality of IDTs 105 between two gratings 205.

In various embodiments, by forming the resonators in a SAW device to have different duty factors, temperature compensation at both sides of a response may be achieved. Accordingly, in order to provide temperature compensation for SAW device 700 at both sides of a response, the series resonator 300-1 is formed to have a relatively high duty factor and the CRF 705 is formed to have a relatively low duty factor. In addition to adjusting the duty factor for the resonator 300-1 and the CRF 705, according to various example embodiments, temperature compensation may also be achieved by altering and/or adjusting an amount of dielectric material that is present for the resonator 300-1 and/or the CRF 705 of the SAW device 700, which is shown and described with regard to FIGS. 8-13.

It should be noted that the example embodiments are not limited to one series resonator 300-1 being coupled with one CRF 705. In various embodiments, more than one CRF stage may be cascaded or otherwise coupled with the CRF 705, more than one resonator 300-1 may be connected in series with the CRF 705, and/or one or more shunt resonators 300-2 may be connected to the CRF 705 and/or to the series resonators. In such embodiments, temperature compensation may be achieved for high frequency transitions and low frequency transitions of a passband by using different duty factors for at least one series resonator 300-1, at least one shunt resonator 300-2, and/or at least one CRF 705.

Figure 8:
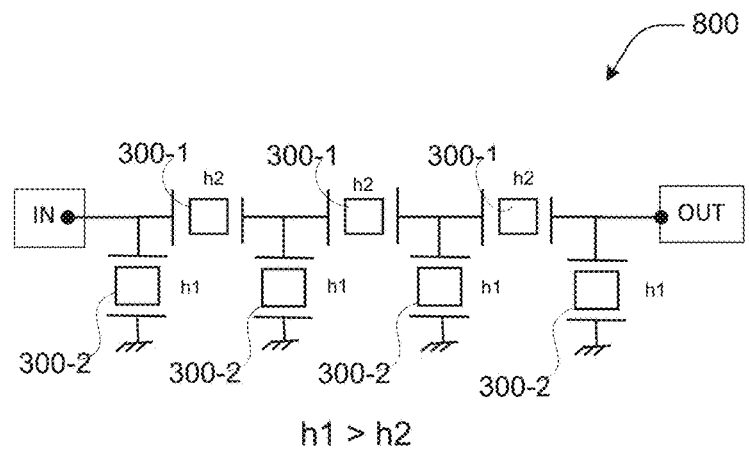
FIG. 8 a circuit diagram of a ladder filter, in accordance with various example embodiments.
Figure 9:
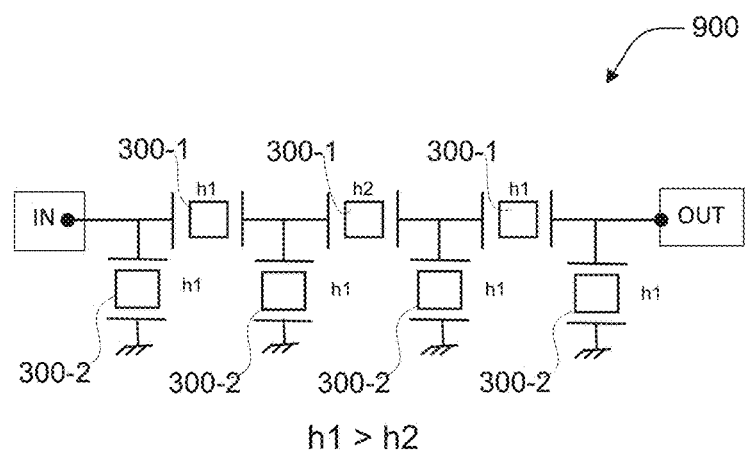
FIG. 9 illustrates a circuit diagram of a ladder filter in accordance with various example embodiments.

FIG. 8 illustrates a circuit diagram of a ladder filter 800 in accordance with various example embodiments. FIG. 9 illustrates a circuit diagram of a ladder filter 900 in accordance with various other example embodiments.

As noted previously noted, the TCF tends to be larger when a duty factor of a resonator 300 is smaller, which may be due to the presence of more dielectric material having a positive TCF between the electrodes 110 forming the resonator 300. Therefore, a similar result may be obtained by choosing a different material stack for the series resonators 300-1 than for the shunt resonators 300-2. Accordingly, alternative to adjusting the duty factors of various resonators 300, temperature compensation may be achieved by covering, burying, or otherwise forming the resonators with different amounts of dielectric material. For example, if shunt resonators 300-2 and series resonators 300-1 are formed such that the duty factor for the shunt resonators 300-2 is the same as the duty factor for the series resonators 300-1, temperature compensation may be obtained by covering the series resonators 300-1 with a smaller amount of dielectric material than an amount of dielectric material covering the shunt resonators 300-2. Such example embodiments are illustrated by FIGS. 8-9.

Referring to FIG. 8, the ladder filter 800 may operate in a same or similar manner as the ladder filter 400 of FIG. 4. However, ladder filter 800 includes series resonators 300-1 that are formed having a dielectric layer thickness h2 above their electrodes and shunt resonators 300-2 that are formed having a dielectric layer thickness h1 above their electrodes, wherein the dielectric layer thickness h1 is greater than the dielectric layer thickness h2. Referring to FIG. 9, the ladder filter 900 may operate in a same or similar manner as the ladder filter 400 of FIG. 4 and/or the ladder filter 800 of FIG. 8. However, ladder filter 900 includes only one series resonator 300-1 that is formed having a dielectric layer thickness h2 while the other series resonators 300-1 and the shunt resonators 300-2 are formed having a dielectric layer thickness h1. According to various embodiments, the dielectric layer thickness h2 above the electrodes 110 forming the resonator 300-1 may be between about 0.65 and about 0.85 times an electrode period P of the plurality of electrodes 110 forming the series resonator 300-1. In some embodiments, the dielectric layer thickness h1 may be at least 2% less than the dielectric layer thickness h2, and in some embodiments, the dielectric layer thickness h1 may be about 5% less dielectric layer thickness h2. In various embodiments, the dielectric layer thickness h1 may have a thickness amount that is greater than the dielectric thickness h2 amount, the dielectric thickness h2 being such that a series resonator 300-1 is to obtain a TCF between +/−10 ppm/deg. C. and preferably between +/−3 ppm/deg. C.

In some embodiments, a SAW device may require only the low band transition or the high band transition to be relatively narrow or relatively steep, which may necessitate a relatively good temperature compensation for only one or more shunt resonators 300-2 or one or more series resonators 300-1. In such embodiments, in order to allow for a larger passband, it may be advantageous to form the SAW device to have a thicker dielectric layer only on one or more resonators 300 corresponding to the frequencies requiring a steeper transition. For example, if a low frequency transition for a SAW device is required to be steeper than the high frequency transition, at least one shunt resonator 300-2 may be formed to have a thicker dielectric layer than one or more other shunt resonators 300-2 and/or one or more series resonators 300-1. By way of another example, if a high frequency transition for a SAW device is required to be steeper than the low frequency transition, at least one series resonator 300-1 may have a thicker dielectric layer than one or more other series resonators 300-1 and/or one or more shunt resonators 300-2. By varying the dielectric layer thicknesses for the resonators in a SAW device, a relatively wide band filter design having a steep transition on one side and thermal stability may be achieved. For example, by using different dielectric thicknesses for at least one series resonator 300-1 or at least one shunt resonator 300-2, SAW device 800 and/or 900 may achieve temperature compensation for one side of a response while maintaining a wide band filter. It should be noted that the difference between the ratios of the dielectric material thicknesses to the electrode periods should be at least 10% and preferably about 25%, in order to achieve a relatively wide band and relatively good temperature compensation. For example, resonators with relatively good temperature compensation may have a dielectric material thickness above their electrodes between about 65% and about 85% of their electrode period while other resonators may have a dielectric material thickness above the electrodes of about 50% of their electrode period.

It should be noted that, although the example embodiments of FIGS. 8 and 9 show ladder filters having at least one series resonator 300-1 with a dielectric layer thickness h2 that is smaller than a dielectric layer thickness h1 of shunt resonators 300-2, the example embodiments are not limited thereto. According to various other example embodiments, the dielectric layer thickness h2 of at least one series resonator 300-1 may be greater than a dielectric layer thickness h1 of shunt resonators 300-2. The dielectric layer thicknesses for the series resonators 300-1 and the shunt resonators 300-2 may be altered according to a side of a response that is desired to be steeper than the other side of the response. In various embodiments, the dielectric layer thickness h2 have an thickness amount greater than the dielectric thickness h1 such that a shunt resonator 300-2 is to obtain a TCF between +/−10 ppm/deg. C. and preferably between +/−3 ppm/deg. C. The dielectric material thicknesses for each of the series resonators 300-1 and each of the shunt resonators 300-2 may be application specific and chosen based on one or more filter and/or system design choices.

It should also be noted that the example embodiments are not limited to ladder filter configurations as shown by FIGS. 8-9. In various embodiments, SAW devices using a CRF cascaded or otherwise coupled with shunt resonators 300-2 and/or series resonators 300-1 may obtain temperature compensation by varying an amount of dielectric material covering or burying at least one shunt resonator 300-2, at least one series resonator 300-1, and/or the CRF. In such embodiments, the low frequency transition between rejection band and the passband may be provided by both the CRF and/or one or more shunt resonators 300-2, while the high frequency transition between the passband and the rejection band may be provided by one or more series resonators 300-1. Such an example embodiment is shown and described with regard to FIG. 10.

Figure 10:
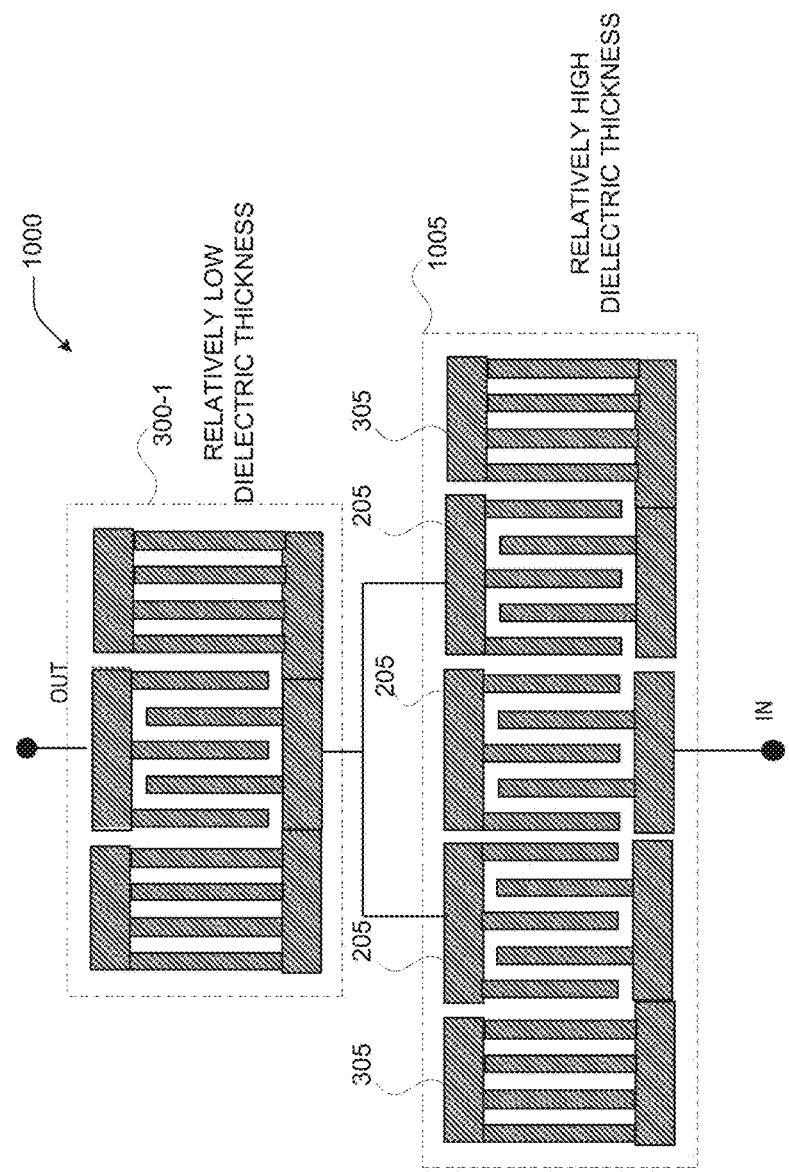
FIG. 10 illustrates a circuit diagram of a SAW device including a CRF, in accordance with various example embodiments.

FIG. 10 illustrates a SAW device 1000 including a CRF 1005 having a first amount dielectric material coupled with a series resonator 300-1 having second amount of dielectric material, wherein the first amount is greater than the second amount, in accordance with various example embodiments. As shown, SAW device 1000 includes an input terminal IN, an output terminal OUT, CRF 1005, and a series resonator 300-1. CRF 1005 is formed of, or otherwise includes a plurality of IDTs 105 between two gratings 205.

In various embodiments, temperature compensation may be achieved by altering and/or adjusting an amount of dielectric material that is present for the resonator 300-1 and/or the CRF 1005 of the SAW device 1000. Accordingly, in order to provide temperature compensation for SAW device 1000 at both ends of a response, the series resonator 300-1 is formed to have a relatively low dielectric layer thickness and the CRF 1005 is formed to have a relatively high dielectric layer thickness. In such embodiments, a difference in the dielectric thicknesses of at least 2% to about 5% may be chosen.

Alternatively, it is possible to obtain relatively good temperature compensation on one side of a response while obtaining a wide pass band. It should be noted that the larger amount of dielectric material may correspond to a side of a response that requires a steeper transition. For instance, for a desired SAW device application, if a lower side of a response requires a steep transition, then the CRF 1005 (or a shunt resonator 300-2) may be formed to have more dielectric material. Conversely, if a desired SAW device application requires that a higher side of a response needs a steep transition, then the series resonator 300-1 may be formed to include more dielectric material. In such embodiments, to obtain a wide pass band and relatively good temperature compensation on one side of a response, the oxide thickness above the electrodes 110 for the resonators 300 may be between 65% and 85% of the electrode period P, while the thickness above the electrodes 110 for the other resonators 300 may be about 50% of the electrode period P or less.

It should be noted that the example embodiments are not limited to one series resonator 300-1 being coupled with one CRF 1005. In various embodiments, more than one CRF stage may be cascaded or otherwise connected to the CRF 1005, more than one resonator 300-1 may be connected in series with the CRF 1005, and/or one or more shunt resonators 300-2 may be connected to the CRF 1005. In such embodiments, by using different dielectric thicknesses for at least one series resonator 300-1, at least one shunt resonator 300-2, and/or the CRF 1005, SAW device 1000 may achieve temperature compensation for one side of a response while maintaining a wide band filter.

Figure 11:
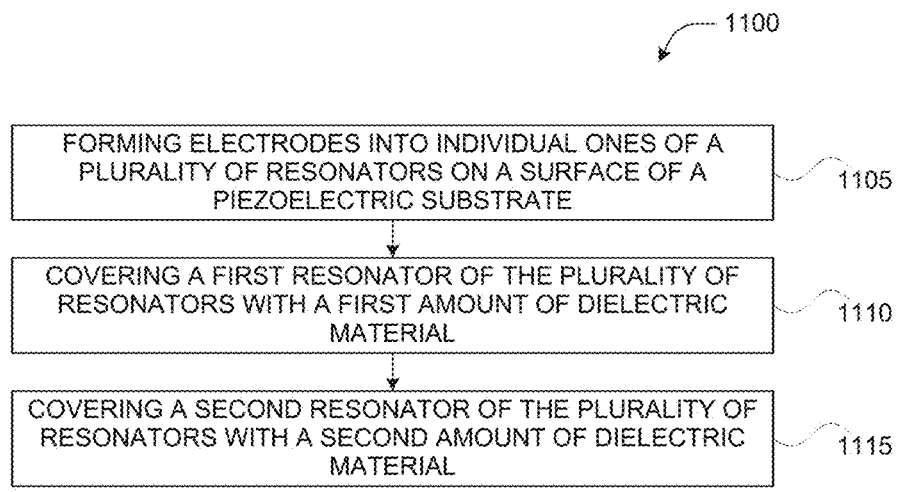
FIG. 11 illustrates a method of forming a temperature compensated SAW device, in accordance with various example embodiments.
Figure 12:
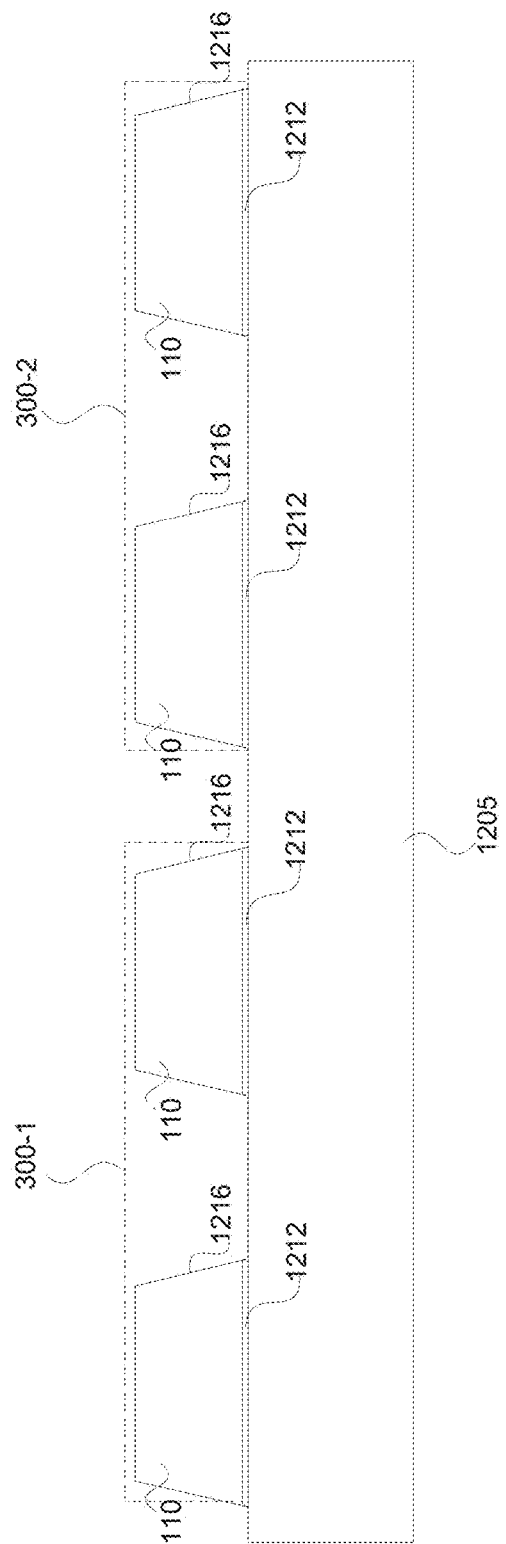
FIGS. 12-13 illustrate various stages of forming the temperature compensated SAW device, in accordance with various example embodiments. In particular.
Figure 13:
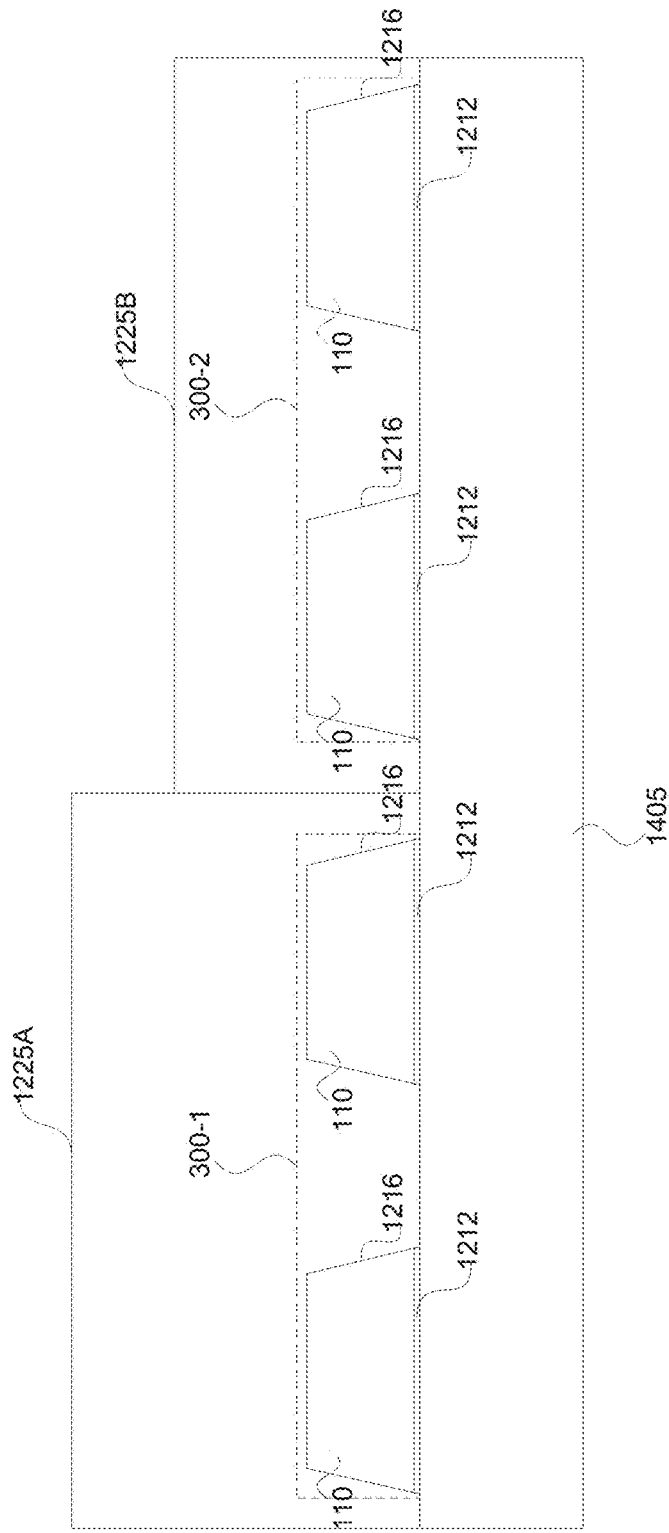

FIG. 11 illustrates a method 1100 of forming a temperature compensated SAW device in accordance with various embodiments. The method 1100 is described with reference to resonators 300-1 and 300-2 with FIGS. 12-13 showing resonators 300-1 and 300-2 after various operations of the method 1300. However, it will be appreciated that the method 1100 may be modified to form any like acoustic wave device according to the example embodiments described herein. Furthermore, various operations are described as multiple discrete operations in turn, in a manner that may be helpful in understanding the claimed subject matter. However, the order of operations as described should not be construed to imply that the operations are necessarily order dependent. In particular, the operations may not be performed in the order of presentation. Operations described may be performed in a different order than the described embodiment. Various additional operations may be performed and/or described operations may be omitted in additional embodiments.

At operation 1105, the method 1100 may include forming one or more electrodes 110 into individual resonators 300-1 and/or 300-2 of a plurality of resonators 300 on a piezoelectric substrate 1205. This processing step is shown in FIG. 12. The piezoelectric substrate 1205 may be formed of any material having a surface to support an acoustic wave, such as lithium niobate (LiNbO$_3$) and/or lithium tantalite (LiTaO$_3$). In various embodiments, the piezoelectric substrate 1205 may be formed to have a cut angle between Y+120 degrees and Y+140 degrees. As shown in FIG. 12, the dashed lines surround the plurality of electrodes 110 forming each of the resonators 300-1 and 300-2. The electrodes 110 may be formed by patterning substrate adhesion layers 1212 on the piezoelectric substrate 1205; followed by patterning conductive material of metal-dominant layers 1216 over the substrate-adhesion layers 1212. The layers of the electrodes 110 may be formed by any suitable process known in the art, such as a lift off process or dry etching process for example. In various embodiments, the electrodes 110 may be formed of a material comprising mostly copper (Cu) or a copper (Cu) alloy. In some embodiments, the electrodes 110 may be formed of a material comprising copper (Cu) or a copper (Cu) alloy, titanium (Ti), and/or aluminum (Al), wherein a majority of each electrode is made up of copper (Cu). For example, in various embodiments, the electrodes 110 may be formed of about 150 A of Ti, about 2500 A of Cu, and about 300 A of Al. However, it should be noted that according to various embodiments, the electrodes 110 may be formed of any material or combination of materials having a density and/or a mass that is greater than the density and/or the mass of Al. Additionally, in embodiments where the electrodes are formed of Cu, Ti, and Al, the Ti may be used to adhere the electrodes to the piezoelectric substrate 1205, while the Al may be used as a protective coating for the Cu.

Operation 1105 may also include forming electrodes 110 of at least one resonator 300 to have a different (more or less) duty factor than other ones of the plurality of resonators 300 based on a configuration of the resonators 300, as described previously. For example, in various embodiments the electrodes 110 may be formed such that an electrode period P and/or a width W of individual electrodes 110 of a plurality of electrodes forming the series resonator 300-1 of the plurality of resonators may be smaller (or larger) than an electrode period P and/or a width W of individual electrodes of a plurality of electrodes 110 forming a shunt resonator 300-2 of the plurality of resonators. In various embodiments, the plurality of electrodes 110 forming the series resonator 300-1 may have a thickness H (not to be confused with the dielectric material thickness h1 or h2 discussed previously) that is between 5% and 15% of an electrode period P of the series resonator 300-1. In various embodiments, the plurality of electrodes 110 forming the shunt resonator 300-2 may have a thickness H that is between 5% and 15% of an electrode period P of the shunt resonator 300-2.

At operation 1110, the method 1100 may include covering a first resonator 300 of the plurality of resonators 300 with a first amount of dielectric material 1225A. At operation 1115, the method 1100 may include covering a second resonator 300 of the plurality of resonators 300 with a second amount of dielectric material 1225B. These processing steps are shown in FIG. 13. The dielectric material 1225A and 1225B may be formed by depositing, for example by physical vapor deposition (PVD), a planarized oxide, for example, silicon dioxide (SiO$_2$), over the electrodes 210. As shown by FIG. 13, the second amount of dielectric material 1225B is less than the first amount of dielectric material 1225A. The specific amounts for the first amount 1225A and/or the second amount 1225B may be application specific and chosen according to one or more filter and/or system design choices. In various embodiments, the first amount 1225A and/or the second amount 1225B may be based on a size of an electrode period of the resonators 300-1 and/or 300-2. For instance, in various embodiments, the second amount 1225B may have a thickness between about 0.65 and about 0.85 times an electrode period P of the plurality of electrodes 210 forming the shunt resonator 300-2. In various embodiments, the first amount 1225A may have a thickness that is about 5% less than the thickness of the second amount 1225B. In various embodiments, the first amount 1225A and/or the second amount 1225B may be about three to about four times thicker than a thickness H of the electrodes.

Furthermore, it should be noted that in various embodiments, operations 1110 and/or 1115 may include forming a same amount of dielectric material 1225A on each of the resonators 300-1 and 300-2, and removing a portion of the dielectric material 1225A from the shunt resonator 300-2 such that the shunt resonator 300-2 is covered by the second amount 1225B. The portion of the dielectric material 1225A may be removed from the shunt resonator 300-2 according to known methods, such as selectively etching the portion using photolithography, optical lithography, and/or the like. In some embodiments, operations 1110 and/or 1115 may include depositing the lowest amount of dielectric material on each of the resonators 300 (e.g., the second amount 1225B), adding an etch stop layer, and depositing the difference between the dielectric layer thicknesses (e.g., first amount 1225A minus second amount 1225B), and then selectively etching a desired one or more of the resonators 300 to arrive at a desired dielectric material thickness. Moreover, in some embodiments, the method 1100 may also include an additional operation of adding a layer of a different material like silicon nitride (SiN) on top of the dielectric layers, which may be used for passivation and/or frequency trimming.

Figure 14:
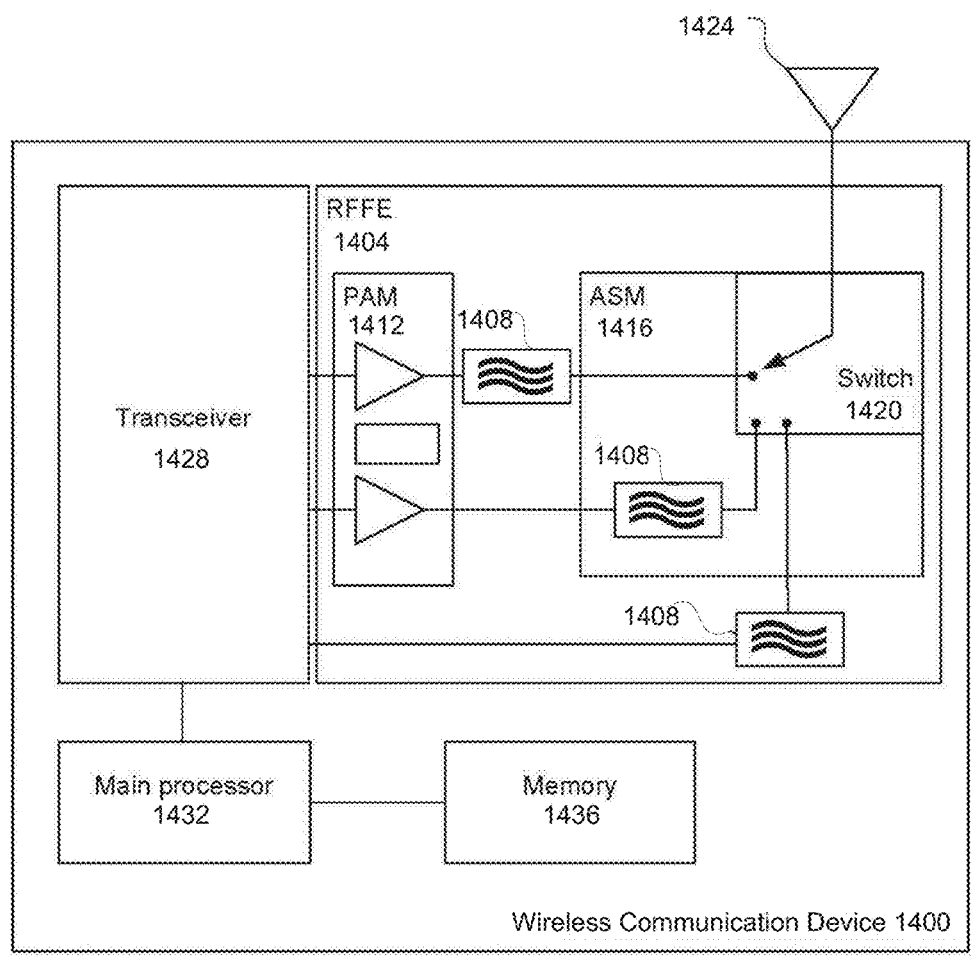
FIG. 14 illustrates an example wireless communication device including one or more SAW devices, in accordance with various example embodiments.

FIG. 14 illustrates a wireless communication device 1400 including one or more SAW devices, in accordance with various example embodiments. A block diagram of an example wireless communication device 1400 is illustrated in FIG. 14 in accordance with various example embodiments. However, it should be noted that the example embodiments of a temperature compensated SAW devices/filters described herein, and apparatuses including such temperature compensated SAW devices/filters may be incorporated into various other apparatuses and/or systems.

The SAW devices 1408 may operate to filter frequencies of transmitted/received signals. Each of the SAW devices 1408 may include any number of resonators 300-1 and/or resonators 300-2 in various arrangements and/or configurations. In some embodiments, the SAW devices 1408 may be integrated with an antenna switch module (ASM) 1416. SAW devices 1408 may additionally or alternatively be disposed external to the ASM 1416 as shown.

The ASM 1416 may include, in addition to one or more SAW devices 1408, a switch 1420 coupled with an antenna 1424. In various embodiments, the antenna 1424 may include one or more directional and/or omnidirectional antennas, including, for example, a dipole antenna, a monopole antenna, a patch antenna, a loop antenna, a microstrip antenna and/or any other type of antenna suitable for over the air (OTA) transmission/reception of RF signals. In various embodiments, the wireless communication device 1400 may include a duplexer comprising one or more SAW devices 1408 instead of the ASM 1416. In such embodiments, the transceiver 1428 may additionally/alternatively include a receiver for receiving RF signals, communicating incoming data, from the duplexer and antenna 1424. In such embodiments, the transceiver 1428 may additionally/alternatively include a transmitter for transmitting RF signals, communicating outgoing data, through the duplexer and antenna 1424. Furthermore, the transmitter and the receiver may include one or more SAW devices 1408.

The switch 1420 may selectively couple the antenna 1424 with various transmit or receive chains. While the wireless communication device 1400 is described with transmitting and receiving capabilities, other embodiments may include devices with only transmitting or only receiving capabilities.

The power amplifier module (PAM) 1412 may be a multi-modal, multi-band power amplifier (MMPA) that integrates a plurality of power amplifiers and control logic to support various frequency bands and communication modes. The PAM 1412 may amplify RF signals received from a transceiver 1428 for transmission via the ASM 1416 and the antenna 1424.

The transceiver 1428 may receive outgoing data (e.g., voice data, web data, e-mail, signaling data, etc.) from a main processor 1432, may generate RF signals to represent the outgoing data, and provide the RF signals to the RFFE 1404. In some embodiments, the transceiver 1428 may generate the RF signals using OFDM modulation. The transceiver 1428 may also receive an incoming OTA signal from the antenna 1424 through the RFFE 1404. The transceiver 1428 may process and send the incoming signal to the main processor 1432 for further processing.

The main processor 1432 may execute a basic operating system program, stored in memory 1436, in order to control the overall operation of the wireless communication device 1400. For example, the main processor 1432 may control the reception of signals and the transmission of signals by transceiver 1428. The main processor 1432 may be capable of executing other processes and programs resident in the memory 1436 and may move data into or out of memory 1436, as desired by an executing process.

In various embodiments, the wireless communication device 1400 may be, but is not limited to, a mobile cellular phone, a desktop personal computer (PC), a laptop PC, a tablet PC, a paging device, a personal digital assistant, a text-messaging device, a laptop computer, a wearable computing device, a subscriber station, an access point, a radar, a satellite communication device, and/or any other device capable of wirelessly transmitting/receiving RF signals.

Those skilled in the art will recognize that the wireless communication device 1400 is given by way of example and that, for simplicity and clarity, only so much of the construction and operation of the wireless communication device 1400 as is necessary for an understanding of the embodiments is shown and described. Various embodiments contemplate any suitable component or combination of components performing any suitable tasks in association with wireless communication device 1400, according to particular needs. Moreover, it is understood that the wireless communication device 1400 should not be construed to limit the types of devices in which embodiments may be implemented.

Various examples are provided below.

Example 1 may include a surface acoustic wave (SAW) device comprising a plurality of resonators, a piezoelectric substrate, and a dielectric layer. The plurality of resonators may include at least a first resonator and a second resonator. Individual resonators of the plurality of resonators are formed by a plurality of electrodes on the surface of the piezoelectric substrate. The dielectric layer may have a positive temperature coefficient of frequency (TCF) and may be formed on each of the plurality of electrodes. A first amount of the dielectric layer formed on the first resonator is different than a second amount of the dielectric layer formed on the second resonator such that the first resonator and/or the second resonator is to obtain a TCF between +/−10 ppm/deg. C. The first amount may be different than the second amount such that the first resonator or the second resonator dielectric is to obtain a TCF between +/−3 ppm/deg. C.

Example 2 may include the SAW device of the preceding example, and/or any other example disclosed herein, wherein the dielectric layer is formed of a silicon oxide material, the plurality of electrodes are formed of a material having a density that is greater than a density of aluminum (Al), and the piezoelectric substrate is formed of lithium niobate (LiNbO3) having a cut angle between Y+120 degrees and Y+140 degrees.

Example 3 may include the SAW device of the preceding examples, and/or any other example disclosed herein, wherein a width of individual electrodes of the plurality of electrodes forming the first resonator is larger than a width of individual electrodes of the plurality of electrodes forming the second resonator and the first resonator is a series resonator.

Example 4 may include the SAW device of any of the preceding examples, and/or any other example disclosed herein, wherein the plurality of resonators includes a plurality of series resonators and a plurality of shunt resonators arranged in a ladder filter configuration, and the first resonator is one of the plurality of series resonators and the second resonator is one of the plurality of shunt resonators.

Example 5 may include the SAW device of the preceding examples, and/or any other example disclosed herein, wherein individual series resonators of the plurality of series resonators are covered by the first amount of the dielectric layer and individual shunt resonators of the plurality of shunt resonators are covered by the second amount of the dielectric layer.

Example 6 may include the SAW device of any of the preceding examples, and/or any other example disclosed herein, wherein only a series resonator of the plurality of series resonators having a lower resonance frequency than other ones of the plurality of series resonators is covered by the first amount of the dielectric layer.

Example 7 may include the SAW device of any of the preceding examples, and/or any other example disclosed herein, wherein a duty factor of the plurality of series resonators is at least 10% greater than a duty factor of the plurality of shunt resonators.

Example 8 may include the SAW device of any of the preceding examples, and/or any other example disclosed herein, wherein the second resonator is a coupled resonator filter and the first resonator is coupled in series with the coupled resonator filter, wherein the second amount of the dielectric layer covers an entirety of the coupled resonator filter, and wherein the second amount is substantially greater than the first amount.

Example 9 may include the SAW device of any of the preceding examples, and/or any other example disclosed herein, wherein a thickness of the first amount above the plurality of electrodes forming the first resonator or the second amount above the plurality of electrodes forming the second resonator is between about 0.65 and about 0.85 times an electrode period of the plurality of electrodes forming the first resonator or the second resonator, wherein the electrode period of the first resonator is based on a physical distance between each of the plurality of electrodes forming the first resonator, and the electrode period of the second resonator is based on a physical distance between each of the plurality of electrodes forming the second resonator.

Example 10 may include the SAW device of any of the preceding examples, and/or any other example disclosed herein, wherein a thickness of the first amount is about 5% less than a thickness of the second amount and the first resonator is a series resonator.

Example 11 may include the SAW device of any of the preceding examples, and/or any other example disclosed herein, wherein the first amount of the dielectric layer formed on the first resonator is greater than the second amount of the dielectric layer formed on the second resonator.

Example 12 may include the SAW device of any of the preceding examples, and/or any other example disclosed herein, wherein the first amount is at least 30% greater than the second amount.

Example 13 may include the SAW device of any of the preceding examples, and/or any other example disclosed herein, wherein the plurality of electrodes are formed of a material comprising copper (Cu) or an alloy including Cu, and the plurality of electrodes have a thickness that is between 5% and 15% of a first electrode period and a second electrode period. The first electrode period may be based on a physical distance between each of the plurality of electrodes forming the first resonator and the second electrode period may be based on a physical distance between each of the plurality of electrodes forming the second resonator.

Example 13.5 may include the SAW device of any of the preceding examples, and/or any other example disclosed herein, wherein the plurality of electrodes are formed of a material comprising copper (Cu), titanium (Ti), and aluminum (Al), and the plurality of electrodes have a thickness that is between 5% and 15% of a first electrode period and a second electrode period. The first electrode period may be based on a physical distance between each of the plurality of electrodes forming the first resonator and the second electrode period may be based on a physical distance between each of the plurality of electrodes forming the second resonator.

Example 14 may include the SAW device of any of the preceding examples, and/or any other example disclosed herein, wherein an electrode period of the second resonator is set such that a duty factor of the second resonator is between 35% and 45%, and an electrode period of the first resonator is set such that a duty factor of the first resonator is greater than 50% and the first resonator is a series resonator.

Example 15 includes a surface acoustic wave (SAW) device comprising a piezoelectric substrate having a surface to support an acoustic wave; a plurality of resonators on the surface of the piezoelectric substrate; and a dielectric layer having a positive thermal coefficient of frequency (TCF) and covering the plurality of resonators. The plurality of resonators may be formed by a plurality of electrodes. The plurality of resonators include at least a first resonator and a second resonator wherein the first resonator is a series resonator. The first resonator has a first duty factor, the second resonator has a second duty factor, and the first duty factor is larger than the second duty factor.

Example 15.5 may include the SAW device of the preceding example, and/or any other example disclosed herein, wherein the first duty factor is larger than the second duty factor.

Example 16 may include the SAW device of any of the preceding examples, and/or any other example disclosed herein, wherein the plurality of resonators includes a plurality of series resonators including the first resonator and a plurality of shunt resonators including the second resonator, and the second duty factor is smaller than a duty factor of other ones of the plurality of shunt resonators.

Example 17 may include the SAW device of any of the preceding examples, and/or any other example disclosed herein, wherein the plurality of resonators includes a plurality of series resonators including the first resonator and a plurality of shunt resonators including the second resonator, and the first duty factor is greater than a duty factor of other ones of the plurality of series resonators and a duty factor of each of the plurality of shunt resonators.

Example 18 may include the SAW device of any of the preceding examples, and/or any other example disclosed herein, wherein the plurality of resonators includes a plurality of series resonators including the first resonator and a plurality of shunt resonators including the second resonator arranged in a ladder filter configuration, and each of the plurality of series resonators have the first duty factor and each of the plurality of shunt resonators have the second duty factor.

Example 19 may include the SAW device of any of the preceding examples, and/or any other example disclosed herein, wherein of the second resonator is a coupled resonator filter, and the first resonator is coupled in series with the coupled resonator filter, and wherein the coupled resonator filter is formed to have the second duty factor.

Example 20 may include the SAW device of any of the preceding examples, and/or any other example disclosed herein, wherein the substrate is lithium niobate (LiNbO3) with an orientation between Y+120 degrees and Y+140 degrees, the thickness of dielectric layer above the plurality of electrodes is between 65% and 85% of the electrode period, and the first duty factor is at least 10% larger than the second duty factor.

Example 21 may include a method of manufacturing a temperature compensated surface acoustic wave (SAW) device. The method may comprise forming a plurality of electrodes into individual resonators of a plurality of resonators on a surface of a piezoelectric substrate, wherein each of the plurality of electrodes are to guide an acoustic wave longitudinally through each of the plurality of resonators on the surface of the piezoelectric substrate; covering a first resonator of the plurality of resonators with a first amount of dielectric material, wherein the first resonator is a series resonator; and covering a second resonator of the plurality of resonators with a second amount of the dielectric layer, wherein the first amount is different than the second amount such that the first resonator or the second resonator dielectric is to obtain a TCF between +/−10 ppm/deg. C. The first amount may be different than the second amount such that the first resonator or the second resonator dielectric is to obtain a TCF between +/−3 ppm/deg. C.

Example 21.5 may include the SAW device of the preceding example, and/or any other example disclosed herein, further comprising covering other ones of the plurality of resonators with a third amount of dielectric material, wherein the third amount is less than the second amount and greater than the first amount.

Example 22 may include the SAW device of any of the preceding examples, and/or any other example disclosed herein, wherein the dielectric material is silicon dioxide ($SiO_2$), and wherein the forming the plurality of electrodes comprises forming the plurality of electrodes for each of the individual resonators of the plurality of resonators from a material having a larger density than aluminum (Al) and/or a larger mass than aluminum (Al).

Example 23 may include the SAW device of any of the preceding examples, and/or any other example disclosed herein, wherein the second amount has a thickness between about 0.65 and about 0.85 times a second electrode period of the plurality of electrodes forming the second resonator, wherein the second electrode period is a physical distance between each of the plurality of electrodes forming the second resonator.

Example 24 may include the SAW device of any of the preceding examples, and/or any other example disclosed herein, wherein the first amount has a thickness at least 5% less than the thickness of the second amount.

Example 25 may include the SAW device of any of the preceding examples, and/or any other example disclosed herein, wherein the first amount has a thickness at least 20% greater than the thickness of the second amount.

Example 26 may include the SAW device of any of the preceding examples, and/or any other example disclosed herein, further comprising forming the piezoelectric substrate from lithium niobate (LiNbO3) with a cut angle between Y+120 degrees and Y+140 degrees; and forming the plurality of electrodes from a material comprising copper (Cu), titanium (Ti), and aluminum (Al). The forming may include forming first electrodes of the plurality of electrodes for the first resonator such that a thickness of the first electrodes is between 5% and 15% of a first electrode period, wherein the first electrode period is a physical distance between each of the first electrodes; and forming second electrodes of the plurality of electrodes for the second resonator such that a thickness of the second electrodes is between 5% and 15% of a second electrode period, wherein the second electrode period is a physical distance between each the second electrodes.

Example 27 includes a wireless communication device. The wireless communication device may comprise radio frequency front end (RFFE) circuitry and a transceiver, coupled with the RFFE circuitry. The RFFE circuitry may comprise a power amplifier module including one or more power amplifiers to amplify an outgoing radio frequency (RF) signal; and a surface acoustic-wave (SAW) device, coupled with the power amplifier module. The SAW device may comprise a piezoelectric substrate having a surface to support an acoustic wave a plurality of resonators including at least a first resonator and a second resonator, wherein individual resonators of the plurality of resonators are formed by a plurality of electrodes on the surface of the piezoelectric substrate; and a dielectric layer having a positive thermal coefficient of frequency (TCF) and formed on each of the plurality of electrodes, wherein an amount of the dielectric layer formed on the first resonator is different than an amount of the dielectric layer formed on the second resonator such that the first resonator or the second resonator is to obtain a TCF between +/−10 ppm/deg. C. The first amount may be different than the second amount such that the first resonator or the second resonator dielectric is to obtain a TCF between +/−3 ppm/deg. C. The transceiver is to receive an incoming RF signal through the RFFE circuitry and provide the outgoing RF signal to the RFFE for transmission.

Example 28 may include the wireless communication device of the preceding example, and/or any other example disclosed herein, wherein the first resonator and the second resonator are formed such that the first resonator has a different duty factor than the second resonator.

Example 29 may include the wireless communication device of the preceding example, and/or any other example disclosed herein, wherein the first resonator has a greater duty factor than the second resonator.

Example 30 may include the wireless communication device of the preceding example, and/or any other example disclosed herein, wherein the first resonator has a smaller duty factor than the second resonator.

Example 31 may include the wireless communication device of the preceding example, and/or any other example disclosed herein, wherein the amount of the dielectric layer formed on the first resonator is less than the amount of the dielectric layer formed on the second resonator.

Example 32 may include the wireless communication device of the preceding example, and/or any other example disclosed herein, wherein the amount of the dielectric layer formed on the first resonator is greater than the amount of the dielectric layer formed on the second resonator.

The foregoing description of the above Examples provides illustration and description for the example embodiments disclosed herein, but the above Examples are not intended to be exhaustive or to limit the scope of the invention to the precise form disclosed. Modifications and variations are possible in light of the above teachings and/or may be acquired from practice of various implementations of the invention.

What is claimed is:
1. A surface acoustic wave (SAW) device comprising:
a piezoelectric substrate having a surface to support an acoustic wave;
a plurality of resonators including at least a first resonator and a second resonator, wherein individual resonators of the plurality of resonators are formed by a plurality of electrodes on the surface of the piezoelectric substrate where a width of individual electrodes of the plurality of electrodes forming the first resonator is larger than a width of individual electrodes of the plurality of electrodes forming the second resonator, wherein the width of the individual electrodes of the plurality of electrodes forming the first resonator and the width of individual electrodes of the plurality of electrodes forming the second resonator is such that a duty factor of a plurality of series resonators is at least 10% greater than a duty factor of a plurality of shunt resonators and the plurality of resonators includes the plurality of series resonators and the plurality of shunt resonators arranged in a ladder filter configuration, and the first resonator is one of the plurality of series resonators and the second resonator is one of the plurality of shunt resonators; and a dielectric layer having a positive temperature coefficient of frequency (TCF) and formed on each of the plurality of electrodes, wherein a first amount of the dielectric layer formed on the first resonator is different than a second amount of the dielectric layer formed on the second resonator such that the first resonator or the second resonator is to obtain a TCF between +/−10 ppm/deg. C.

2. The SAW device of claim 1, wherein the dielectric layer is formed of a silicon oxide material, the plurality of electrodes are formed of a material having a density that is greater than a density of aluminum (Al), and the piezoelectric substrate is formed of lithium niobate (LiNbO3) having a cut angle between Y+120 degrees and Y+140 degrees.

3. The SAW device of claim 1, wherein individual series resonators of the plurality of series resonators are covered by the first amount of the dielectric layer and individual shunt resonators of the plurality of shunt resonators are covered by the second amount of the dielectric layer.

4. The SAW device of claim 1, wherein only a series resonator of the plurality of series resonators having a lower resonance frequency than other ones of the plurality of series resonators is covered by the first amount of the dielectric layer.

5. The SAW device of claim 1, wherein the second resonator is a coupled resonator filter and the first resonator is coupled in series with the coupled resonator filter, wherein the second amount of the dielectric layer covers an entirety of the coupled resonator filter, and wherein the second amount is substantially greater than the first amount.

6. The SAW device of claim 1, wherein a thickness of the first amount above the plurality of electrodes forming the first resonator or the second amount above the plurality of electrodes forming the second resonator is between about 0.65 and about 0.85 times an electrode period of the plurality of electrodes forming the first resonator or the second resonator, wherein the electrode period of the first resonator is based on a physical distance between each of the plurality of electrodes forming the first resonator, and the electrode period of the second resonator is based on a physical distance between each of the plurality of electrodes forming the second resonator.

7. The SAW device of claim 1, wherein a thickness of the first amount is about 5% less than a thickness of the second amount and the first resonator is a series resonator.

8. The SAW device of claim 1, wherein the first amount of the dielectric layer formed on the first resonator is greater than the second amount of the dielectric layer formed on the second resonator.

9. The SAW device of claim 8, wherein the first amount is at least 30% greater than the second amount.

10. The SAW device of claim 1, wherein the plurality of electrodes are formed of a material comprising copper (Cu) or an alloy including Cu, and the plurality of electrodes have a thickness that is between 5% and 15% of a first electrode period and a second electrode period.

11. The SAW device of claim 1, wherein an electrode period of the second resonator is set such that a duty factor of the second resonator is between 35% and 45%, and an electrode period of the first resonator is set such that a duty factor of the first resonator is greater than 50% and the first resonator is a series resonator.

12. A surface acoustic wave (SAW) device comprising:
a piezoelectric substrate having a surface to support an acoustic wave;
a plurality of resonators on the surface of the piezoelectric substrate, the plurality of resonators including at least a first resonator and a second resonator, wherein the plurality of resonators are formed by a plurality of electrodes, the first resonator has a first duty factor, the second resonator has a second duty factor, the first duty factor is larger than the second duty factor, and the first resonator is a series resonator where a width of individual electrodes of the plurality of electrodes forming the first resonator is larger than a width of individual electrodes of the plurality of electrodes forming the second resonator, wherein the width of the individual electrodes of the plurality of electrodes forming the first resonator and the width of individual electrodes of the plurality of electrodes forming the second resonator is such that the first duty factor is at least 10% greater than the second duty factor and the plurality of resonators includes a plurality of series resonators and a plurality of shunt resonators arranged in a ladder filter configuration, and the first resonator is one of the plurality of series resonators and the second resonator is one of the plurality of shunt resonators; and
a dielectric layer having a positive thermal coefficient of frequency (TCF) and covering the plurality of resonators.

13. The SAW device of claim 12, wherein the plurality of resonators includes the plurality of series resonators including the first resonator and the plurality of shunt resonators including the second resonator, and the second duty factor is smaller than a duty factor of other ones of the plurality of shunt resonators.

14. The SAW device of claim 12, wherein each of the plurality of series resonators have the first duty factor and each of the plurality of shunt resonators have the second duty factor.

15. The SAW filter of claim 12, wherein the second resonator is a coupled resonator filter, and the first resonator is coupled in series with the coupled resonator filter, wherein the coupled resonator filter is formed to have the second duty factor.

16. The SAW filter of claim 12, wherein the piezoelectric substrate is lithium niobate (LiNbO3) with an orientation between Y+120 degrees and Y+140 degrees, a thickness of the dielectric layer above the plurality of electrodes is between 65% and 85% of an electrode period.

17. A wireless communication device comprising:
a radio frequency front end (RFFE) circuitry comprising:
a power amplifier module including one or more power amplifiers to amplify an outgoing radio frequency (RF) signal; and
a surface acoustic-wave (SAW) device, coupled with the power amplifier module, comprising:
a piezoelectric substrate having a surface to support an acoustic wave;
a plurality of resonators including at least a first resonator having a plurality of electrodes on the surface of the piezoelectric substrate, and a second resonator having a plurality of electrodes on the surface of the piezoelectric substrate where a width of individual electrodes of the plurality of electrodes forming the first resonator is larger than a width of individual electrodes of the plurality of electrodes forming the second resonator and the plurality of resonators includes a plurality of series resonators, wherein the width of the individual electrodes of the plurality of electrodes forming the first resonator and the width of the individual electrodes of the plurality of electrodes forming the second resonator are such that a duty factor of the plurality of series resonators is at least 10% greater than a duty factor of a plurality of shunt resonators and the plurality of shunt resonators is arranged in a ladder filter configuration, and the first resonator is one of the plurality of series resonators and the second resonator is one of the plurality of shunt resonators; and a dielectric layer having a positive thermal coefficient of frequency (TCF) and formed on each of the plurality of electrodes, wherein an amount of the dielectric layer formed on the first resonator is different than an amount of the dielectric layer formed on the second resonator such that the first resonator or the second resonator is to obtain a TCF between +/−10 ppm/deg. C.; and a transceiver, coupled with the RFFE circuitry, to receive an incoming RF signal through the RFFE circuitry and provide the outgoing RF signal to the RFFE for transmission.

18. The wireless communication device of claim 17, wherein the first resonator and the second resonator are formed such that the first resonator has a different duty factor than the second resonator.

\* \* \* \* \*